US010088518B1

(12) United States Patent
Xie et al.

(10) Patent No.: US 10,088,518 B1
(45) Date of Patent: Oct. 2, 2018

(54) APPARATUS AND METHOD FOR CLASSIFYING AND LOCATING ELECTRICAL FAULTS IN CIRCUITRY

(71) Applicant: Intel Corporation, Santa Clara, CA (US)

(72) Inventors: Mayue Xie, Phoenix, AZ (US); Zhiguo Qian, Chandler, AZ (US); Jong-Ru Guo, Portland, OR (US); Zhichao Zhang, Chandler, AZ (US); Zuoguo Wu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 15/474,674

(22) Filed: Mar. 30, 2017

(51) Int. Cl.
*G01R 31/08* (2006.01)
*G01R 31/28* (2006.01)

(52) U.S. Cl.
CPC ..... *G01R 31/2853* (2013.01); *G01R 31/2884* (2013.01); *G01R 31/2896* (2013.01)

(58) Field of Classification Search
CPC ............ G01R 31/2884; G01R 31/2896; G01R 31/2805; G01R 31/024; G01R 31/2812; G01R 31/2853; G01R 31/2822; G01R 31/11; G01R 31/08; G01R 31/21; G01R 31/085; G01R 31/083; G01R 31/088; G01R 31/3016; G01R 31/3008; G01R 31/3004; G01R 31/318307; G01R 31/31924; G01R 31/31922; G01R 31/318511; G01R 31/318505; G01R 31/2831; G01R 31/318513; G01R 31/31905; G01R 31/2632; G01R 31/2635; G01R 31/2608; G01R 31/2614; G01R 31/2621; G01R 31/275
See application file for complete search history.

(56) References Cited

U.S. PATENT DOCUMENTS

| 5,557,638 A * | 9/1996 | Fisher | H03K 5/088 341/118 |
|---|---|---|---|
| 2007/0154213 A1 * | 7/2007 | Hinderthur | H04B 10/0771 398/25 |
| 2011/0264388 A1 * | 10/2011 | Gong | G01R 31/086 702/58 |
| 2014/0278161 A1 * | 9/2014 | Chen | G01R 31/088 702/59 |

* cited by examiner

*Primary Examiner* — Thang Le
(74) *Attorney, Agent, or Firm* — Schwegman Lundberg & Woessner, P.A.

(57) ABSTRACT

A die with a transmission circuit, a reception circuit, and a comparison circuit can be provided. The transmission circuit can be configured to transmit a first signal through a first channel at a first transmission rate and a first transmission amplitude. The reception circuit can be in communication with the transmission circuit through the first channel. The reception circuit can receive a second signal at a first reception rate and at a first reception amplitude. The comparison circuit can be in communication with the transmission circuit and the reception circuit. The comparison circuit can be configured to: determine a first rate error value, determine a first amplitude error value, compare the first rate error value with a rate threshold to determine a first rate error occurrence, and compare the first amplitude error value with an amplitude threshold to determine a first amplitude error occurrence.

20 Claims, 5 Drawing Sheets

500

510
TRANSMITTING A FIRST SIGNAL THROUGH A FIRST CHANNEL AT A FIRST TRANSMISSION RATE AND A FIRST TRANSMISSION AMPLITUDE, WHEREIN ONE OR MORE PROPERTIES OF THE FIRST CHANNEL TRANSFORM THE FIRST SIGNAL INTO A SECOND SIGNAL;

520
RECEIVING THE SECOND SIGNAL THROUGH THE FIRST CHANNEL AT A FIRST RECEPTION RATE AND AT A FIRST RECEPTION AMPLITUDE;

530
COMPARING THE SECOND SIGNAL TO THE FIRST SIGNAL BY: COMPARING THE FIRST TRANSMISSION RATE TO THE FIRST RECEPTION RATE AND DETERMINE A FIRST RATE ERROR VALUE; COMPARING THE FIRST TRANSMISSION AMPLITUDE TO THE FIRST RECEPTION AMPLITUDE TO DETERMINE A FIRST AMPLITUDE ERROR VALUE; COMPARING THE FIRST RATE ERROR VALUE WITH A RATE THRESHOLD TO DETERMINE A FIRST RATE ERROR OCCURRENCE; AND COMPARING THE FIRST AMPLITUDE ERROR VALUE WITH AN AMPLITUDE THRESHOLD TO DETERMINE A FIRST AMPLITUDE ERROR OCCURRENCE.

*Fig. 5*

APPARATUS AND METHOD FOR CLASSIFYING AND LOCATING ELECTRICAL FAULTS IN CIRCUITRY

BACKGROUND

Integrated circuits can be interconnected to other integrated circuits. Integrated circuits can be coupled to a package. Multiple integrated circuits can be coupled a package. The integrated circuits or the packages can have channels configured to transmit electrical energy. The channels can have faults.

SUMMARY

The present inventors have recognized, among other things, that a problem to be solved can include determining the presence of an electrical fault in an electrical communication channel. The present inventors have recognized, among other things, that a problem to be solved can also include determining the location of an electrical fault in an electrical communication channel. The present inventors have recognized, among other things, that a problem to be solved can further include determining the type of electrical fault in an electrical communication channel. The present inventors have recognized, among other things, that a problem to be solved can still further include coupling additional components to a faulty integrated circuit. The present inventors have recognized, among other things, that a problem to be solved can additionally include determining the location of an electrical fault through non-destructive procedures.

The present subject matter can help provide a solution to this problem, such as by providing a die with a transmission circuit, a reception circuit, and a comparison circuit. The transmission circuit can be configured to transmit a first signal through a first channel at a first transmission rate and a first transmission amplitude. One or more properties of the first channel can transform the first signal into a second signal. The reception circuit can be in communication with the transmission circuit through the first channel. The reception circuit can receive the second signal at a first reception rate and at a first reception amplitude.

The comparison circuit can be in communication with the transmission circuit and the reception circuit. The comparison circuit can be configured to compare the first transmission rate to the first reception rate and determine a first rate error value. The comparison circuit can be configured to compare the first transmission amplitude to the first reception amplitude to determine a first amplitude error value. The comparison circuit can be configured to compare the first rate error value with a rate threshold to determine a first rate error occurrence. The comparison circuit can be configured to compare the first amplitude error value with an amplitude threshold to determine a first amplitude error occurrence.

The comparison circuit can be configured to determine a presence of an electrical fault with the first rate error occurrence or the first amplitude error occurrence. The comparison circuit can be configured to determine a location of an electrical fault with the first rate error occurrence or the first amplitude error occurrence. The use of the transmission circuit, reception circuit, or the comparison circuit can determine the presence of a fault within the die, or a first component (e.g., a channel), and prevent further components from being coupled to the die, or the first component, thereby wasting the further components.

Aspect 1 can include or use subject matter (such as an apparatus, a system, a device, a method, a means for performing acts, or a device readable medium including instructions that, when performed by the device, can cause the device to perform acts), such as can include or use a transmission circuit, a reception circuit, and a comparison circuit. The transmission circuit can be configured to transmit a first signal through a first channel at a first transmission rate and a first transmission amplitude. One or more properties of the first channel can transform the first signal into a second signal. The reception circuit can be in communication with the transmission circuit through the first channel. The reception circuit can receive the second signal at a first reception rate and at a first reception amplitude.

The comparison circuit can be in communication with the transmission circuit and the reception circuit. The comparison circuit can be configured to compare the first transmission rate to the first reception rate and determine a first rate error value. The comparison circuit can be configured to compare the first transmission amplitude to the first reception amplitude to determine a first amplitude error value. The comparison circuit can be configured to compare the first rate error value with a rate threshold to determine a first rate error occurrence. The comparison circuit can be configured to compare the first amplitude error value with an amplitude threshold to determine a first amplitude error occurrence.

Aspect 2 can include or use, or can optionally be combined with the subject matter of Aspect 1, to optionally include or use that the die is a first die and the transmission circuit is located on the first die and the reception circuit is located on a second die.

Aspect 3 can include or use, or can optionally be combined with the subject matter of one or any combination of Aspects 1 or 2 to optionally include or use that the comparison circuit is further configured to determine a presence of an electrical fault with the first rate error occurrence or the first amplitude error occurrence.

Aspect 4 can include or use, or can optionally be combined with the subject matter of one or any combination of Aspects 1 through 3 to optionally include or use that the comparison circuit is further configured to determine a location of an electrical fault with the first rate error occurrence or the first amplitude error occurrence.

Aspect 5 can include or use subject matter (such as an apparatus, a system, a device, a method, a means for performing acts, or a device readable medium including instructions that, when performed by the device, can cause the device to perform acts), such as can include or use a first transmission circuit, a first reception circuit, and a comparison circuit. The first transmission circuit can be configured to transmit a first signal through a first channel at a first transmission rate and a first transmission amplitude. One or more properties of the first channel can transform the first signal into a second signal. The first reception circuit can be in communication with the first transmission circuit through the first channel. The first reception circuit can receive the second signal at a first reception rate and at a first reception amplitude.

Aspect 6 can include or use, or can optionally be combined with the subject matter of Aspect 5, to optionally include or use that the first transmission circuit and the first reception circuit are located on a first die.

Aspect 7 can include or use, or can optionally be combined with the subject matter of one or any combination of Aspects 5 or 6 to optionally include or use a second reception circuit located on a second die. The second reception circuit can be in communication with the first transmission circuit through a second channel.

Aspect 8 can include or use, or can optionally be combined with the subject matter of one or any combination of Aspects 5 through 7 to optionally include or use that the first transmission circuit can be configured to transmit a third signal through the second channel at a second transmission rate and a second transmission amplitude. One or more properties of the second channel can transform the third signal into a fourth signal. The second reception circuit can receive the fourth signal at a second reception rate and at a second reception amplitude.

Aspect 9 can include or use, or can optionally be combined with the subject matter of one or any combination of Aspects 5 through 8 to optionally include or use that the comparison circuit can be in communication with the first transmission circuit and a second reception circuit. The comparison circuit can be further configured to compare a second transmission rate to a second reception rate and determine a second rate error value. The comparison circuit can be further configured to compare a second transmission amplitude to a second reception amplitude to determine a second amplitude error value. The comparison circuit can be further configured to compare the second rate error value with the rate threshold to determine a second rate error occurrence. The comparison circuit can be further configured to compare the second amplitude error value with the amplitude threshold to determine a second amplitude error occurrence.

Aspect 10 can include or use, or can optionally be combined with the subject matter of one or any combination of Aspects 5 through 9 to optionally include or use that the transmission circuit can be located on a first die and the first reception circuit can be located on a second die.

Aspect 11 can include or use subject matter (such as an apparatus, a system, a device, a method, a means for performing acts, or a device readable medium including instructions that, when performed by the device, can cause the device to perform acts), such as can include or use a method for classifying and locating electrical faults in circuitry. The method can include transmitting a first signal through a first channel at a first transmission rate and a first transmission amplitude. One or more properties of the first channel can transform the first signal into a second signal. The method can include receiving the second signal through the first channel at a first reception rate and at a first reception amplitude. The method can include comparing the second signal to the first signal by comparing the first transmission rate to the first reception rate and determine a first rate error value. The method can include comparing the second signal to the first signal by comparing the first transmission amplitude to the first reception amplitude to determine a first amplitude error value. The method can include comparing the second signal to the first signal by comparing the first rate error value with a rate threshold to determine a first rate error occurrence. The method can include comparing the second signal to the first signal by comparing the first amplitude error value with an amplitude threshold to determine a first amplitude error occurrence.

Aspect 12 can include or use, or can optionally be combined with the subject matter of Aspect 11, to optionally include or use determining a presence of an electrical fault with the first rate error occurrence or the first amplitude error occurrence.

Aspect 13 can include or use, or can optionally be combined with the subject matter of one or any combination of Aspects 11 or 12 to optionally include or use determining a location of an electrical fault the first rate error occurrence or the first amplitude error occurrence.

Aspect 14 can include or use, or can optionally be combined with the subject matter of one or any combination of Aspects 11 through 13 to optionally include or use transmitting a third signal through the first channel at a second transmission rate and a second transmission amplitude, wherein one or more properties of the first channel transform the third signal into a fourth signal. Aspect 14 can include or use, or can optionally be combined with the subject matter of one or any combination of Aspects 11 through 13 to optionally include or use receiving the fourth signal through the first channel at a second reception rate and at a second reception amplitude.

Aspect 15 can include or use, or can optionally be combined with the subject matter of one or any combination of Aspects 11 through 14 to optionally include or use the first transmission rate is different than the second transmission rate or the first transmission amplitude is different than the second transmission amplitude.

Aspect 16 can include or use, or can optionally be combined with the subject matter of one or any combination of Aspects 11 through 15 to optionally include or use comparing a third signal to a fourth signal by comparing a second transmission rate to a second reception rate to determine a second rate error value. The third signal can be compared to the fourth signal by comparing a second transmission amplitude to a second reception amplitude to determine a second amplitude error value. The third signal can be compared to the fourth signal by comparing the second rate error value with the rate threshold to determine a second rate error occurrence. The third signal can be compared to the fourth signal by comparing the second amplitude error value with the amplitude threshold to determine a second amplitude error occurrence.

Aspect 17 can include or use, or can optionally be combined with the subject matter of one or any combination of Aspects 11 through 16 to optionally include or use determining a presence of an electrical fault with the first rate error occurrence and the second error rate occurrence, or the first amplitude error occurrence and the second amplitude error occurrence.

Aspect 18 can include or use, or can optionally be combined with the subject matter of one or any combination of Aspects 11 through 17 to optionally include or use determining a location of an electrical fault the first rate error occurrence and the second error rate occurrence, or the first amplitude error occurrence and the second amplitude error occurrence.

Aspect 19 can include or use, or can optionally be combined with the subject matter of one or any combination of Aspects 11 through 18 to optionally include or use establishing the first channel between a first die and a second die.

Aspect 20 can include or use, or can optionally be combined with the subject matter of one or any combination of Aspects 11 through 19 to optionally include or use establishing a second channel between a first die and a second die, wherein the first signal is transmitted through the first channel before the second channel is established.

Each of these non-limiting examples can stand on its own, or can be combined in various permutations or combinations with one or more of the other examples.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 illustrates an example method for classifying and locating electrical faults.

DETAILED DESCRIPTION

Figure 1:
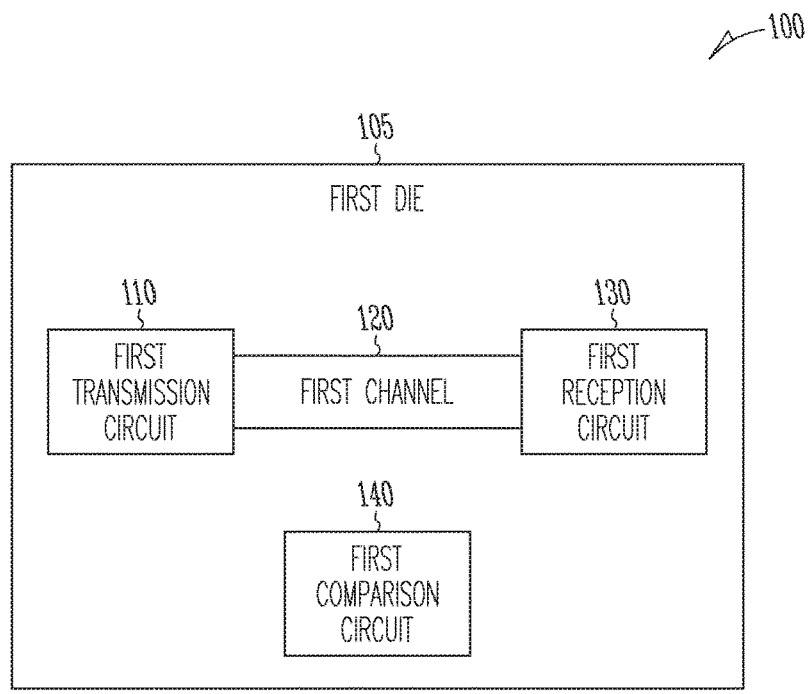
FIG. 1 illustrates a schematic view of an apparatus for classifying and locating electrical faults.

FIG. 1 illustrates a schematic view of an apparatus 100 for classifying and locating electrical faults. The apparatus 100 can include a first die 105. The apparatus 100 can include a first transmission circuit 110, a first channel 120, a first reception circuit 130, and a first comparison circuit 140. The reception circuit 130 can be in communication with the transmission circuit 110 through the first channel 120. The comparison circuit 140 can be in communication with the transmission circuit 110 and the reception circuit 120.

The transmission circuit 110 can be configured to transmit the first signal through the first channel 120 at a first transmission amplitude (e.g., a specific voltage). The first transmission amplitude can vary. In an example, the first transmission amplitude is 0.8V. The transmission circuit 110 can be configured to transmit the first signal through the first channel 120 at a first transmission rate (e.g., transmitting the first signal a certain number of times per second). The first transmission rate can vary. In an example, the first transmission rate is 10 picoseconds. One or more properties (e.g., impedance, physical length, material properties, defects, or faults) of the first channel 120 can transform the first signal into a second signal.

As discussed herein, the reception circuit 130 can be in communication with the transmission circuit 110 through the first channel 120. The reception circuit 130 can receive the second signal at a first reception rate. The reception circuit 130 can receive the second signal at a first reception amplitude. Propagating the first signal through the first channel 120 can produce the second signal. The first channel 120 can transform the first transmission amplitude into the first reception amplitude. The first channel can transform the first transmission rate into the first reception rate. Transmission of the first signal within the first channel 120 at the first transmission rate can produce the second signal at the first reception rate within the first channel 120. Transmission of the first signal within the first channel 120 at the first transmission amplitude can produce the second signal at the first reception amplitude within the first channel 120.

As discussed herein, the comparison circuit 140 can be in communication with the transmission circuit 110. Additionally, the comparison circuit 140 can be in communication with the reception circuit 130. The comparison circuit 140 can be configured to compare the first transmission rate to the first reception rate and determine a first rate error value. The comparison circuit 140 can be configured to compare the first rate error value with a rate threshold to determine a first rate error occurrence. The rate threshold can be equal to the first transmission rate. The rate threshold can be a statistical bin limit. The rate threshold can be a predefined range of values that correspond to acceptable transmission rates. The first transmission rate can be altered (e.g., increased or decreased) in response to the first rate error occurrence. Altering the first transmission rate can cause electrical faults to become apparent, in contrast to maintaining a constant first transmission rate.

The comparison circuit 140 can be configured to compare the first transmission amplitude to the first reception amplitude to determine a first amplitude error value. The comparison circuit 140 can be configured to compare the first amplitude error value with an amplitude threshold to determine a first amplitude error occurrence. The amplitude threshold can be equal to the first transmission amplitude. The amplitude threshold can be a statistical bin limit. The amplitude threshold can be a predefined range of values that correspond to acceptable signal amplitudes. The first transmission amplitude can be altered (e.g., increased or decreased) in response to the first amplitude error occurrence. Altering the first transmission amplitude can cause electrical faults to become apparent, in contrast to maintaining a constant first transmission amplitude.

The comparison circuit 140 can be configured to refine the statistical bin limit by determining if a component is operational (e.g., does not include faults) and incorporating the first rate error value or the first amplitude error value into the statistical bin limit determination. Refining the statistical bin limit can prevent operational components from being discarded due to non-compliance with the statistical bin limit.

Electrical faults can be caused by one or more defects in the first channel 120. The comparison circuit 140 can be configured to determine a presence of an electrical fault (e.g., short, open, leak, high resistance, low resistance), such as in the first channel 120 or other channels, with the first rate error occurrence or the first amplitude error occurrence, such as when the first rate error occurrence or the first amplitude error occurrence exceed a predefined value. The comparison circuit 140 can be configured to determine a location of an electrical fault, such as in the first channel 120 or other channels, with the first rate error occurrence or the first amplitude error occurrence, such as when the first rate error occurrence or the first amplitude error occurrence exceed a predefined value. The comparison circuit 140 can determine the presence, or location, of an electrical fault by use of time domain reflectometry. The time domain reflectometry can be analog or digital. The comparison circuit 140 can determine the presence, or location, of an electrical fault by use of vector network analysis.

In an example, the comparison module 140 can use the first amplitude error occurrence to determine the presence of a short in the first channel 120. If the first amplitude error value is less than the predefined threshold, the comparison circuit 140 can be configured to generate a signal indicating the presence of a short within the first channel 120. In an example, the comparison module 140 can use the first rate error occurrence to determine the presence of an open circuit in the first channel 120. If the first rate error value is less than the rate threshold, the comparison module can be configured to generate a signal indicating the presence of an open circuit within the first channel 120.

In an example, the comparison module 140 can use the first amplitude error occurrence to determine the location of a short in the first channel 120. The magnitude of the difference between the first amplitude error value and the amplitude threshold can provide information indicating the location of the short within the first channel 120. If the magnitude of the difference between the first amplitude error value and the amplitude threshold is small, the short is located proximate to the transmission circuit 110. If the magnitude of the difference between the first amplitude error value and the amplitude threshold is large, the short is located proximate to the reception circuit 130. In an example, if the first reception amplitude is greater than the first transmission amplitude and the first reception rate is greater than the first transmission rate, then the first channel 120 will generally have a high impedance.

Additionally, the comparison module 140 can use the first rate error occurrence to determine the location of an open circuit in the first channel 120. The magnitude of the difference between the first rate error value and the rate threshold can provide information indicating the location of the short within the first channel 120. If the magnitude of the difference between the first rate error value and the rate threshold is large, the open circuit is located proximate to the transmission circuit 110. If the magnitude of the difference between the first rate error value and the rate threshold is small, the open circuit is located proximate to the reception circuit 130.

The transmission circuit 110 and the reception circuit 130 can be combined into a single transmission-reception circuit (not shown). The transmission circuit 110, the reception circuit 130, and the comparison circuit 140 can be combined into a single transmission-reception-comparison circuit (not shown). The transmission circuit 110 can be reconfigured to operate with the same functions as the reception circuit 130. The reception circuit 130 can be reconfigured to operate with the same functions as the transmission circuit 110.

Figure 2:
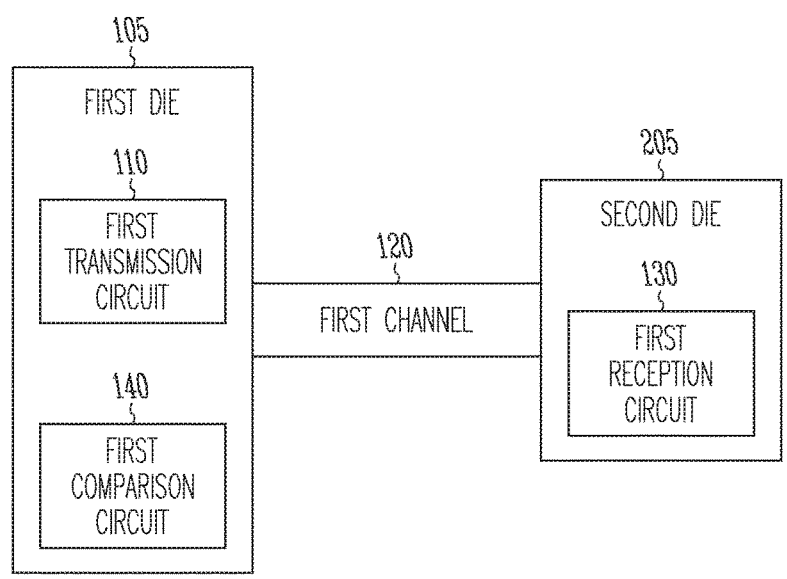
FIG. 2 illustrates a schematic view of a first system for classifying and locating electrical faults, including a first die and a second die.

FIG. 2 illustrates a schematic view of a first system 200 for classifying and locating electrical faults, including a first die 105 and a second die 205. The first and second die can be in communication (e.g., interconnected) through a first channel 120. The first die 105 can include a first transmission circuit 110 and a first comparison circuit 140. The comparison circuit 140 can be included in the second die 205 instead of the first die 105. The second die 205 can include a first reception circuit 130. Similar to the apparatus 100, the first system 200 can be configured to determine the presence, or location, of a fault within the first channel 120. The first system 200 can be configured to determine the presence, or location, of a fault within other channels, such as channels contained entirely within the first die 105, channels contained entirely within the second die 205, or channels that interconnect the first die 105 with the second die 205 (e.g., the first channel 120).

Figure 3:
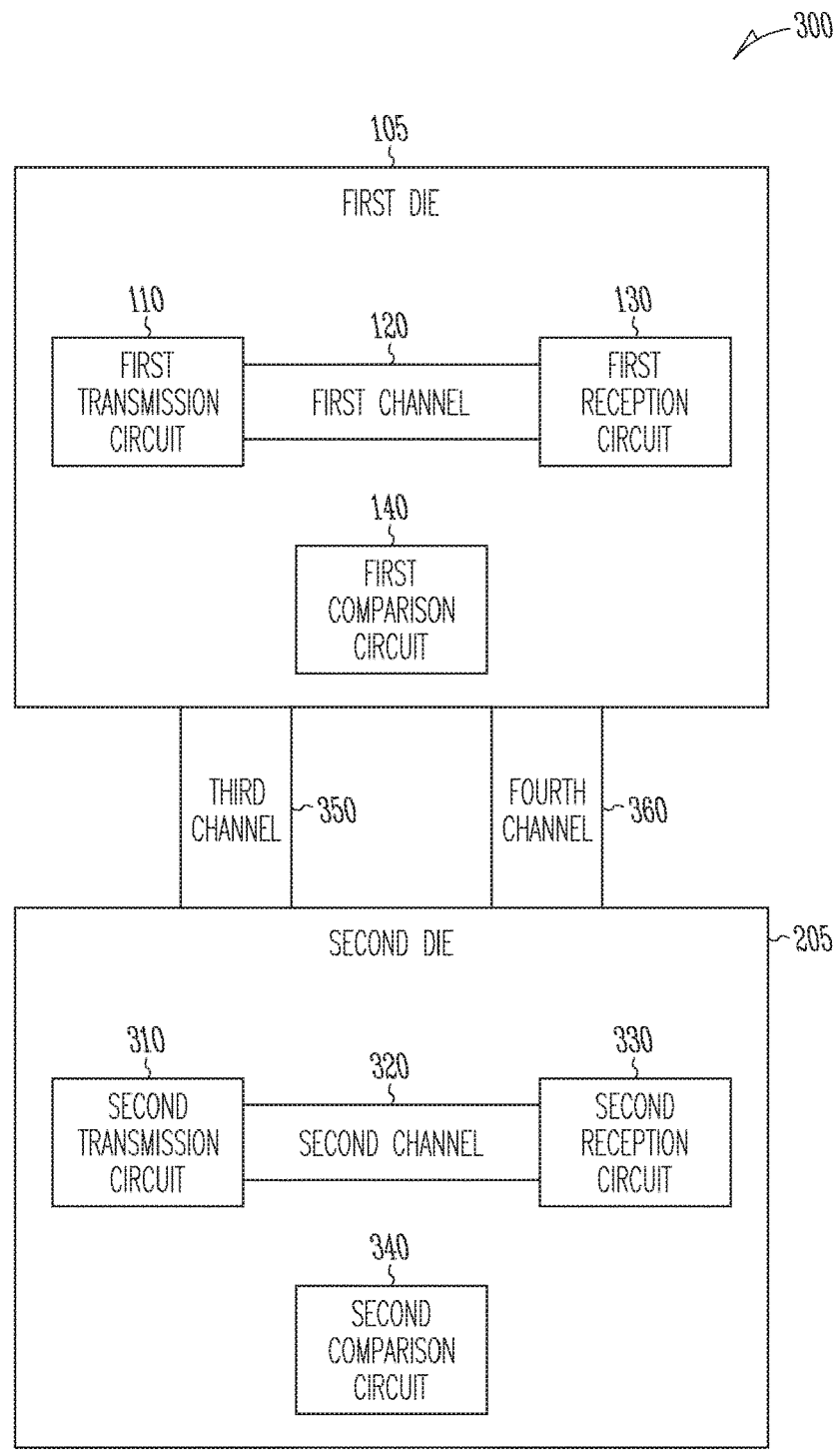
FIG. 3 illustrates a schematic view of a second system for classifying and locating electrical faults, including a first die and a second die.

FIG. 3 illustrates a schematic view of a second system 300 for classifying and locating electrical faults, including a first die 105 and a second die 205. The first die 105 can include a first transmission circuit 110, a first channel 120, a first reception circuit 130, and a first comparison circuit 140. The second die 205 can include a second transmission circuit 310, a second channel 320, a second reception circuit 330, and a second comparison circuit 340. A third channel 350 can interconnect the first die 105 and the second die 205. Additional channels, such as fourth channel 360, can interconnect (e.g., establish electrical communication pathways between) the first die 105 and the second die 205. The third channel 350 or the fourth channel 360 can be located in a package configured to interconnect one or more die (e.g., the first die 105) to additional components (e.g., the second die 205).

In an example, the first transmission circuit 110 can generate a first signal that propagates through the first channel 120. The first channel 120 can transform the first signal into a second signal. The second signal can be received by the first reception circuit 130. The comparison circuit 140 can determine the presence, or location, of faults within the first channel 120. The first transmission circuit 110 can generate additional signals that propagate through other channels of the first die 105, and determine the presence, or location, of faults within the other channels.

As discussed herein, the first reception circuit 130 can be reconfigured to operate with the same functions as the first transmission circuit 110. Similarly, the first transmission circuit 110 can be reconfigured to operate with the same functions as the first reception circuit 130. Reconfiguration of the first transmission circuit 110 and the first reception circuit 130 can increase the resolution (e.g., the precision or accuracy) of the determination of a presence, or location, of a fault within the first channel 120.

The reconfigured first reception circuit 130 can generate a third signal that is propagated through the first channel 120. The third signal can he at a second transmission rate. The third signal can be at a second transmission amplitude. The first channel 120 can transform the third signal into a fourth signal. The fourth signal can be received by the first transmission circuit 110. The reconfigured first transmission circuit 110 can receive the fourth signal at a second reception rate. The reconfigured first transmission circuit 110 can receive the fourth signal at a second reception amplitude.

The comparison circuit 140 (or the comparison circuit 340) can compare the second transmission rate to the second reception rate and determine a second rate error value. The comparison circuit 140 can compare the second transmission amplitude to the second reception amplitude to determine a second amplitude error value. The comparison circuit 140 can compare the second rate error value with the rate threshold to determine a second rate error occurrence. The comparison circuit 140 can compare the second amplitude error value with the amplitude threshold to determine a second amplitude error occurrence.

The transmission of the first and third signals can allow for increased resolution in detection of a presence of a fault or a location of the fault within the fiat channel 120, as compared to transmission of the first signal alone. Additional signals, such as a fifth signal, can also be used to increase the resolution of a presence of a fault or a location of the fault within the first channel. The resolution can be increased by testing the first channel 120 (or other channels) from both sides and comparing the results (e.g., with the comparison circuit 140), thereby increasing the amount of data used to determine the presence of the fault, or the location of the fault. Testing both sides of the channel 120 can also serve as a verification of the results of testing from a single side of the first channel 120.

The first transmission circuit 110 and the first reception circuit 130 can be reconfigured to test both sides of other channels, such as the third channel 350 or the fourth channel 360. Similarly, the second transmission circuit 310 and the second reception circuit 330 can be reconfigured to test both sides of a channel, such as the second channel 320, the third channel 350, or the fourth channel 360.

In an example, if one or more faults are detected within the first die 105, the first die 105 can be discarded. If the first die 105 is free from faults, the second die 105 can be coupled (e.g., interconnected) with the first die 105. The coupling of the second die 205 with the first die 105 can be permanent (e.g., the second die 205 cannot be decoupled from the first die 105 without damage resulting to the first die 105 or the second die 205). Coupling the second die 205 to the first die 105 after determining a lack of faults within the first die 105 can reduce waste by preventing additional components (e.g., the second die 205) from being coupled to a faulty first die 105.

In another example, the first die 105 is coupled to a package (not shown). The package can include one or more channels, such as the third channel 350. The third channel 350 can be tested in accordance with the present subject matter and a presence, or location, of faults within the third channel 350 of the package can be determined before coupling additional components (e.g., the second die 205) to the package, thereby preventing waste. The present subject matter can be used to determine a presence, or location of faults in a wide variety of channels, including channels in: die-to-die interconnects, packages, interposers, embedded multi-die interconnect bridges, wire-bonds, vias, silicon interposers, through silicon vias, traces, ball grid arrays, multi-chip modules, or the like.

The components of the first die 105 can cooperate with the components of the second die 205 to test the channels (e.g., the third and fourth channels 350 and 360) interconnecting the first die 105 with the second die 205. As discussed herein, the first die 105 and the second die 205 can be coupled to a package. The third and fourth channels 350 and 360 can be located within the package, but is not so limited. The first transmission circuit 110 can cooperate with the second reception circuit 330 to determine a presence, or location, of a fault within the third channel 350. The second transmission circuit 310 can cooperate with the first reception circuit 130 to determine a presence, or location, of a fault within the fourth channel 350. The components of the first die 105 and the second die 205 can cooperate to test other channels.

Figure 4:
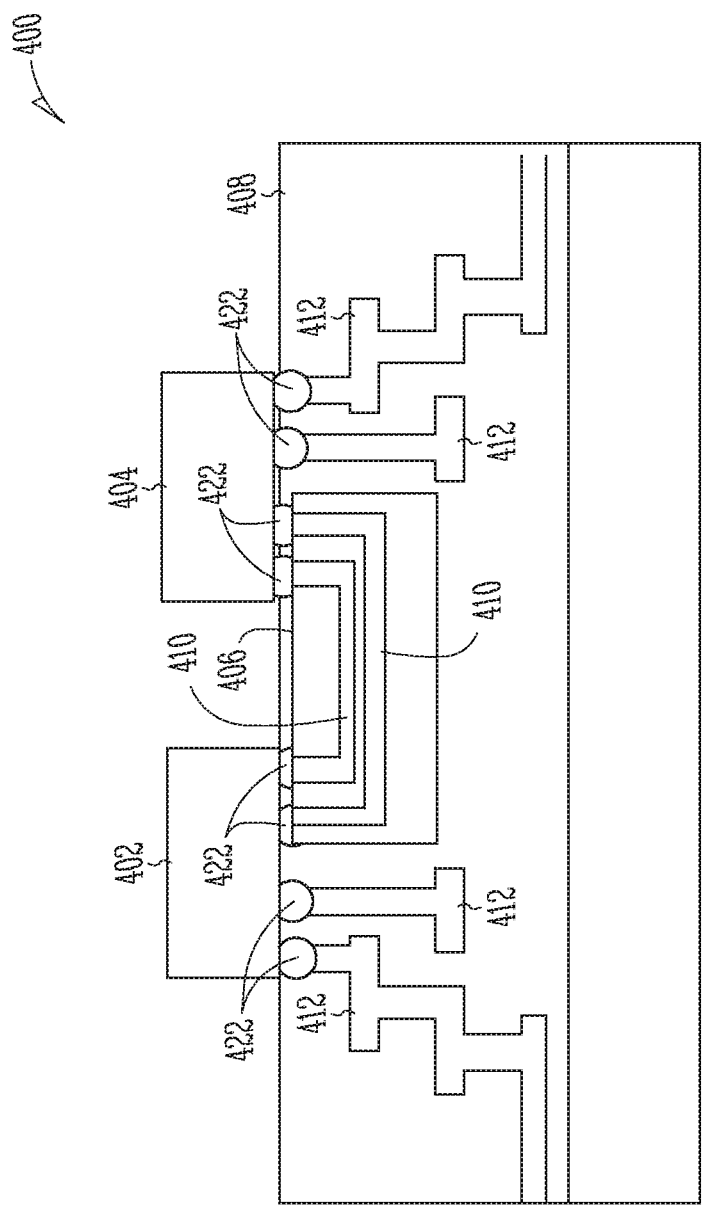
FIG. 4 illustrates, by way of example, a cross-section view diagram of an embodiment of a third system.

FIG. 4 illustrates, by way of example, a cross-section view diagram of an embodiment of a third system 400. The third system 400 can allow signals to be communicated between chips 402 and 404 through a high density interconnect structure 406 and to the chips 402 and 404 through a substrate 408. A high density interconnect structure 406 can be a chip dedicated to signal routing and created using a chip manufacturing technique. Routing density of interconnects 410 in the high density interconnect structure 406 can be up to 100 times (or more) more dense than a routing density of interconnects 412 in the substrate 408. Such an increase in density can allow for a reduction in overall area that a device consumes, thus allowing for more discreet packaging. Solder bumps 422 can interconnect the chips 402 and 404 with the high density interconnect structure 406, the substrate 408, the interconnects 410, or the interconnects 412.

The chips 402 and 404 or the high density interconnect structure 406 can be configured to include a transmission module (e.g., the transmission module 110 of FIG. 1). The chips 402 and 404 or the high density interconnect structure 406 can be configured to include a reception module (e.g., the reception module 130 of FIG. 1). The chips 402 and 404 or the high density interconnect structure 406 can be configured to include a comparison module (e.g., the comparison module 140 of FIG. 1). The transmission module, the reception module, or the comparison module can be configured to determine the presence, or location, of faults within channels within the substrate 408 (e.g., the interconnects 412) or channels within the high density interconnect structure 406 (e.g., the interconnects 410), or within the solder bumps 422. Stated another way, the third system 400 can include similar parts and use similar operating characteristics as the apparatus 100, or the first or second systems 200 or 300.

FIG. 5 illustrates an example method 500 for classifying and locating electrical faults. The method 500 can include at operation 510 transmitting a first signal through a first channel (e.g., the first channel 120 of FIG. 1) at a first transmission rate and a first transmission amplitude, wherein one or more properties of the first channel transform the first signal into a second signal. The method 500 can include at operation 520 receiving the second signal through the first channel at a first reception rate and at a first reception amplitude. The method 500 can include at operation 530 comparing the second signal to the first signal by: comparing the first transmission rate to the first reception rate and determine a first rate error value; comparing the first transmission amplitude to the first reception amplitude to determine a first amplitude error value; comparing the first rate error value with a rate threshold to determine a first rate error occurrence; and comparing the first amplitude error value with an amplitude threshold to determine a first amplitude error occurrence.

The method 500 can also include determining a presence of an electrical fault with the first rate error occurrence or the first amplitude error occurrence. The method 500 can further include determining a location of an electrical fault the first rate error occurrence or the first amplitude error occurrence. The method 500 can still further include transmitting a third signal through the first channel at a second transmission rate and a second transmission amplitude, wherein one or more properties of the first channel transform the third signal into a fourth signal; The method 500 can still yet further include receiving the fourth signal through the first channel at a second reception rate and at a second reception amplitude.

The method 500 can additionally include that the first transmission rate is different than the second transmission rate or the first transmission amplitude is different than the second transmission amplitude. The method 500 can likewise include comparing a third signal to a fourth signal by: comparing a second transmission rate to a second reception rate to determine a second rate error value; comparing a second transmission amplitude to a second reception amplitude to determine a second amplitude error value; comparing the second rate error value with the rate threshold to determine a second rate error occurrence; and comparing the second amplitude error value with the amplitude threshold to determine a second amplitude error occurrence.

The method 500 can also include determining a presence of an electrical fault with the first rate error occurrence and the second error rate occurrence or the first amplitude error occurrence and the second amplitude error occurrence. The method 500 can further include determining a location of an electrical fault the first rate error occurrence and the second error rate occurrence or the first amplitude error occurrence and the second amplitude error occurrence. The method 500 can still further include establishing the first channel between a first die (e.g., the first die 105 of FIG. 1) and a second die (e.g., the second die 205 of FIG. 2).

Figure 6:
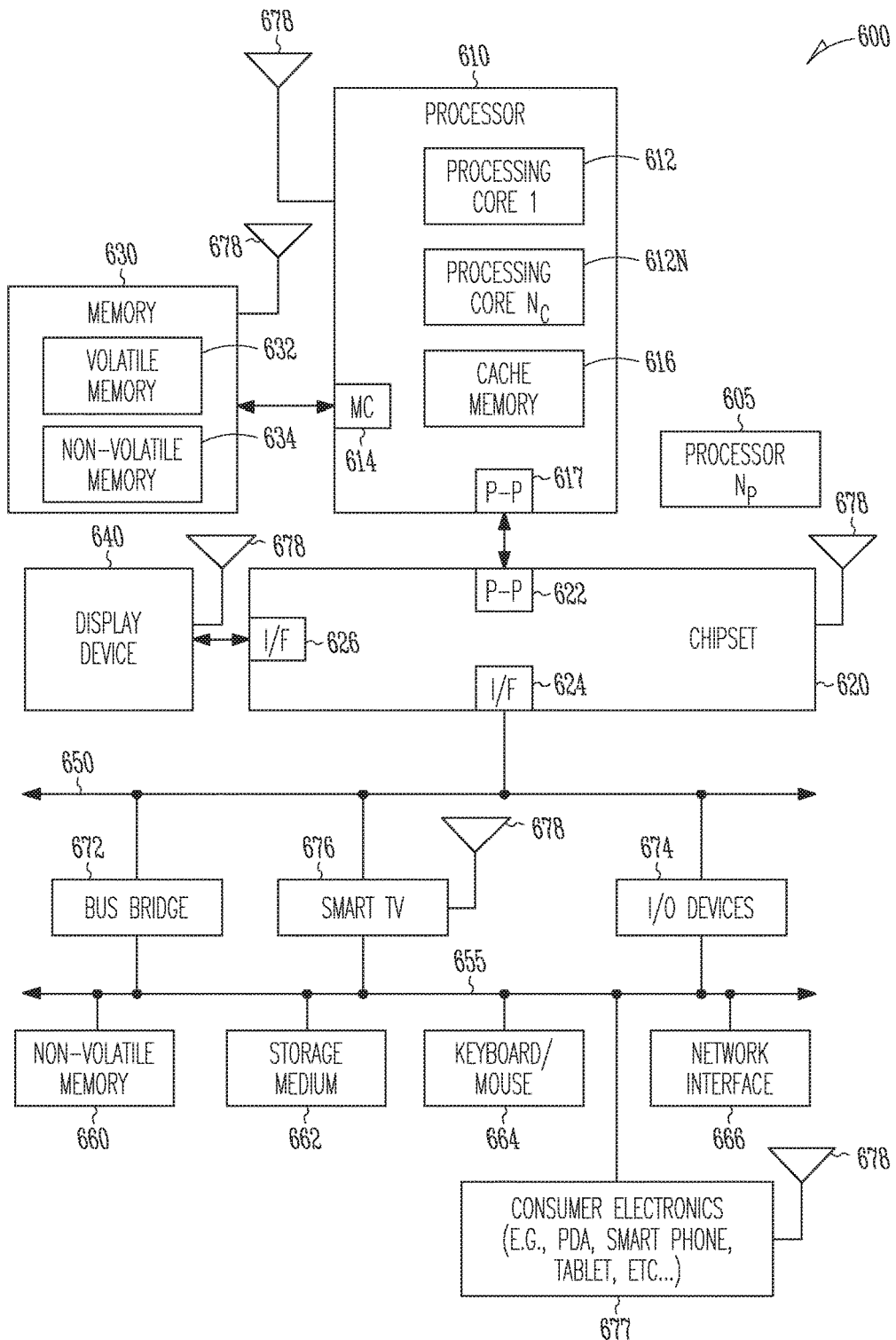
FIG. 6 illustrates a system level diagram, depicting an example of an electronic device (e.g. system) including the apparatus 100 as described in the present disclosure.

FIG. 6 illustrates a system level diagram, depicting an example of an electronic device (e.g., system) including the apparatus 100 (or the first, second, or third systems 200, 300, or 400) as described in the present disclosure. FIG. 6 is included to show an example of a higher level device application for the apparatus 100 (or the first, second, or third systems 200, 300, or 400). In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) [this is the term in FIG.—alternative to revise FIG. to "mass storage device (s)"— as used in para. 8] 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

Various Notes

The above description. includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B"

includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the life. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to he illustrative, and not restrictive. For example, the above-described examples (or one or more aspects thereof) may be used in combination with each other. Other embodiments can he used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will riot be used to interpret or limit the scope or meaning of the claims. Also, in the above Detailed Description, various features may he grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus, comprising:
    a transmission circuit configured to transmit a first signal through a first channel at a first transmission rate and a first transmission amplitude, wherein one or more properties of the first channel transform the first signal into a second signal;
    a reception circuit in communication with the transmission circuit through the first channel, and the reception circuit receives the second signal at a first reception rate and at a first reception amplitude;
    a comparison circuit in communication with the transmission circuit and the reception circuit, wherein the comparison circuit is configured to:
        compare the first transmission rate to the first reception and determine a first rate error value;
        compare the first transmission amplitude to the first reception amplitude to determine a first amplitude error value;
        compare the first rate error value with a rate threshold to determine a first rate error occurrence; and
        compare the first amplitude error value with an amplitude threshold to determine a first amplitude error occurrence.

2. The apparatus of claim 1, wherein the die is a first die and the transmission circuit is located on the first die and the reception circuit is located on a second die.

3. The apparatus of claim 1, wherein the comparison circuit is further configured to determine a presence of an electrical fault with the first rate error occurrence or the first amplitude error occurrence.

4. The apparatus of claim 1, wherein the comparison circuit is further configured to determine a location of an electrical fault with the first rate error occurrence or the first amplitude error occurrence.

5. A system, comprising:
    a first transmission circuit configured to transmit a first signal through a first channel at a first transmission rate and a first transmission amplitude, wherein one or more properties of the first channel transform the first signal into a second signal;
    a first reception circuit in communication with the first transmission circuit through the first channel, and the first reception circuit receives the second signal at a first reception rate and at a first reception amplitude;
    a comparison circuit in communication with the first transmission circuit and the first reception circuit, wherein the comparison circuit is configured to:
        compare the first transmission rate to the first reception rate and determine a first rate error value;
        compare the first transmission amplitude to the first reception amplitude to determine a first amplitude error value;
        compare the first rate error value with a rate threshold to determine a first rate error occurrence; and
    compare the first amplitude error value with an amplitude threshold to determine a first amplitude error occurrence.

6. The system of claim 5, wherein the first transmission circuit and the first reception circuit are located on a first die.

7. The system of claim 6, further comprising a second reception circuit located on a second die, wherein the second reception circuit is in communication with the first transmission circuit through a second channel.

8. The system of claim 7, wherein:
    the first transmission circuit is configured to transmit a third signal through the second channel at a second transmission rate and a second transmission amplitude, wherein one or more properties of the second channel transform the third signal into a fourth signal; and the second reception circuit receives the fourth signal at a second reception rate and at a second reception amplitude.

9. The system of claim 5, wherein the comparison circuit is in communication with the first transmission circuit and a second reception circuit, the comparison circuit further configured to:
compare a second transmission rate to a second reception rate and determine a second rate error value;
compare a second transmission amplitude to a second reception amplitude to determine a second amplitude error value;
compare the second rate error value with the rate threshold to determine a second rate error occurrence; and
compare the second amplitude error value with the amplitude threshold to determine a second amplitude error occurrence.

10. The system of claim 5, wherein the transmission circuit is located on a first die and the first reception circuit is located on a second die.

11. A method for classifying and locating electrical faults in circuitry comprising:
transmitting, by a transmission circuit, a first signal through a first channel at a first transmission rate and a first transmission amplitude, wherein one or more properties of the first channel transform the first signal into a second signal;
receiving, by a reception circuit, the second signal through the first channel at a first reception rate and at a first reception amplitude;
comparing, by a comparison circuit, the second signal to the first signal by:
comparing the first transmission rate to the first reception rate and determine a first rate error value; comparing the first transmission amplitude to the first reception amplitude to determine a first amplitude error value; comparing the first rate error value with a rate threshold to determine a first rate error occurrence; and comparing the first amplitude error value with an amplitude threshold to determine a first amplitude error occurrence".

12. The method of claim 11, further comprising determining a presence of an electrical fault with the first rate error occurrence or the first amplitude error occurrence.

13. The method of claim 11, further comprising determining a location of an electrical fault the first rate error occurrence or the first amplitude error occurrence.

14. The method of claim 11, further comprising:
transmitting a third signal through the first channel at a second transmission rate and a second transmission amplitude, wherein one or more properties of the first channel transform the third signal into a fourth signal; and
receiving the fourth signal through the first channel at a second reception rate and at a second reception amplitude.

15. The method of claim 14, wherein the first transmission rate is different than the second transmission rate or the first transmission amplitude is different than the second transmission amplitude.

16. The method of claim 11, further comprising:
comparing a third signal to a fourth signal by:
comparing a second transmission rate to a second reception rate to determine a second rate error value;
comparing a second transmission amplitude to a second reception amplitude to determine a second amplitude error value;
comparing the second rate error value with the rate threshold to determine a second rate error occurrence; and
comparing the second amplitude error value with the amplitude threshold to determine a second amplitude error occurrence.

17. The method of claim 16, further comprising determining a presence of an electrical fault with the first rate error occurrence and the second error rate occurrence, or the first amplitude error occurrence and the second amplitude error occurrence.

18. The method of claim 16, further comprising determining a location of an electrical fault the first rate error occurrence and the second error rate occurrence, or the first amplitude error occurrence and the second amplitude error occurrence.

19. The method of claim 11, further comprising establishing the first channel between a first die and a second die.

20. The method of claim 11, further comprising establishing a second channel between a first die and a second die, wherein the first signal is transmitted through the first channel before the second channel is established.

* * * * *

UNITED STATES PATENT AND TRADEMARK OFFICE
CERTIFICATE OF CORRECTION

PATENT NO. : 10,088,518 B1
APPLICATION NO. : 15/474674
DATED : October 2, 2018
INVENTOR(S) : Xie et al.

Page 1 of 1

It is certified that error appears in the above-identified patent and that said Letters Patent is hereby corrected as shown below:

On the Title Page

In item (22), in "Filed", in Column 1, Line 1, after "2017", insert --¶(65) Prior Publication Data US 2018/0284185 A1 Oct. 4, 2018--

In the Claims

In Column 14, Line 11, in Claim 1, after "reception", insert --rate--

In Column 15, Line 42, in Claim 11, delete "occurrence"." and insert --occurrence.-- therefor Signed and Sealed this
Twenty-second Day of February, 2022

Drew Hirshfeld
*Performing the Functions and Duties of the
Under Secretary of Commerce for Intellectual Property and
Director of the United States Patent and Trademark Office*